US009063178B2

(12) United States Patent
Woelfel et al.

(10) Patent No.: US 9,063,178 B2
(45) Date of Patent: Jun. 23, 2015

(54) SYSTEM FOR MEASURING CURRENT AND METHOD OF MAKING SAME

(75) Inventors: James H. Woelfel, Richfield, WI (US); Kaijam M. Woodley, Milwaukee, WI (US)

(73) Assignee: Eaton Corporation, Cleveland, OH (US)

( * ) Notice: Subject to any disclaimer, the term of this patent is extended or adjusted under 35 U.S.C. 154(b) by 460 days.

(21) Appl. No.: 13/192,262

(22) Filed: Jul. 27, 2011

(65) Prior Publication Data

US 2013/0027022 A1  Jan. 31, 2013

(51) Int. Cl.
| G01R 15/18 | (2006.01) |
| G01R 3/00 | (2006.01) |
| G01R 1/38 | (2006.01) |
| G01R 19/18 | (2006.01) |
| G01R 1/30 | (2006.01) |
| G01R 31/08 | (2006.01) |
| G01R 15/00 | (2006.01) |
| G01R 22/06 | (2006.01) |
| G01R 15/08 | (2006.01) |
| G01R 21/06 | (2006.01) |
| G01R 13/02 | (2006.01) |
| G01R 19/22 | (2006.01) |
| G01R 15/09 | (2006.01) |

(Continued)

(52) U.S. Cl.
CPC ........... *G01R 15/18* (2013.01); *Y10T 29/49117* (2015.01); *G01R 15/005* (2013.01); *G01R 22/06* (2013.01); *G01R 15/08* (2013.01); *G01R 21/06* (2013.01); *H03M 2201/2216* (2013.01); *G01R 13/0218* (2013.01); *G01R 15/002* (2013.01); *G01R 19/22* (2013.01); *G01R 15/09* (2013.01); *G01R 31/343* (2013.01); *G01R 19/0092* (2013.01)

(58) Field of Classification Search
CPC ...... G01R 15/08; G01R 15/09; G01R 15/002; G01R 15/005; G01R 15/18; G01R 15/181–15/188; G01R 21/06; G01R 22/06; G01R 13/0218; G01R 19/0092; G01R 19/22; H03M 2201/2216
USPC .............................. 324/115, 123 R, 523, 120
See application file for complete search history.

(56) References Cited

U.S. PATENT DOCUMENTS 3,699,391 A * 10/1972 Eilts .................................. 361/47
4,719,361 A * 1/1988 Brubaker ........................ 290/45

(Continued)

FOREIGN PATENT DOCUMENTS

PL           183372 B1     6/2002

OTHER PUBLICATIONS

Search Report and Written Opinion from PCT Application No. PCT/US2012/048055 dated Oct. 11, 2013.

*Primary Examiner* — Patrick Assouad
*Assistant Examiner* — Hoang X Nguyen
(74) *Attorney, Agent, or Firm* — Ziolkowski Patent Solutions Group, SC

(57) ABSTRACT

A system for measuring current includes a current monitoring system comprises a current sensor configured to sense a first current passing through a conductor and a voltage conversion device coupled to the current sensor and configured to receive a second current from the current sensor and convert the second current into a first voltage. A first scaling circuit is coupled to the voltage conversion device and configured to convert the first voltage to a second voltage proportional to the first current based on a first scaling factor, and a second scaling is circuit coupled to the voltage conversion device and configured to convert the first voltage to a third voltage proportional to the first current based on a second scaling factor, wherein the second scaling factor is different from the first scaling factor.

20 Claims, 1 Drawing Sheet

(51) Int. Cl.
*G01R 31/34* (2006.01)
*G01R 19/00* (2006.01)

(56) References Cited

U.S. PATENT DOCUMENTS

| | | | |
|---|---|---|---|
| 4,978,911 A * | 12/1990 | Perry et al. | 324/142 |
| 5,037,518 A * | 8/1991 | Young et al. | 204/228.5 |
| 5,581,254 A * | 12/1996 | Rundel | 341/155 |
| 5,920,189 A * | 7/1999 | Fisher et al. | 324/115 |
| 2002/0008523 A1 * | 1/2002 | Klang | 324/429 |
| 2003/0025514 A1 | 2/2003 | Benes | |
| 2005/0134490 A1 * | 6/2005 | Cox | 341/141 |
| 2008/0243402 A1 * | 10/2008 | Rene et al. | 702/58 |
| 2009/0312970 A1 * | 12/2009 | Kalenine | 702/64 |
| 2011/0025299 A1 * | 2/2011 | Vulovic et al. | 324/115 |

* cited by examiner

SYSTEM FOR MEASURING CURRENT AND METHOD OF MAKING SAME

BACKGROUND OF THE INVENTION

Embodiments of the invention relate generally to primary transformers such as a motor and, more particularly, to measuring current flowing through a primary transformer for use in detecting motor operational status.

In general, three-phase induction motors consume a large percentage of all generated electrical capacity. Many applications for this "workhorse" of industry are fan and pump industrial applications. Due to the prevalence of motors in industry, it is paramount that the three-phase motor be reliable. Industry reliability surveys suggest that motor failures typically fall into one of four major categories. Specifically, motor faults typically result from bearing failure, stator turn faults, rotor bar failure, or other faults/failures. Within these four categories: bearing, stator, and rotor failure account for a majority of all motor failures.

Detection devices have been designed that generate feedback regarding an operating motor. The feedback is then monitored to determine the operating conditions of the motor. A common industrial practice is to measure current using the same principles as a transformer. A magnetic field is induced around a conductor as current is passed through the conductor. This magnetic field may be induced into a magnetic coil looped around the conductor. This method is similar to an air core transformer and is commonly referred to as a current transformer. The amount of magnetically induced current into the coil is dependent on the number of coil loops and the amount of signal current desired. The current signal, therefore, should be proportional to the actual current in the conductor of interest. A scale is developed to read the coupled current signal value in the conductor as an actual current signal.

The output of the current transformer may be used to sense an overcurrent condition in the motor by sensing a high current passing through the conductor, for example. Once detected, the overcurrent condition may be set up to drive an overload relay to shut off the motor. Sensing a high current for overcurrent protection includes sensing a wide range of current that may pass through the conductor. The sensing circuit may have to provide feedback for a range of up to six times the normal operating range of the motor for overcurrent protection such as, for example, 750 amps.

Often, the sensed current is converted from an analog signal to a digital signal. Sensing and converting such a wide range of current to a digital signal results in a large step size between each digital value. For a circuit providing overcurrent protection, such a coarse digital step size scale is often adequate to provide motor protection prior to conditions leading to motor failure. However, besides sensing the motor current for purposes of overcurrent protection, it may be desirable to sense the currents flowing through the motor while the motor is operating in its steady-state mode of operation. In this case, the coarse digital step size of the scale set up for overcurrent protection is often too large to provide reliable accurate information when used for both overcurrent feedback as well as steady-state operation feedback.

Typically, current transformers that are used in sensing the motor current through the conductor are costly, heavy, and occupy a large amount of space within the system. Accordingly, simply adding an additional current transformer with associated sensing circuit into a system for each desired current sensing range is prohibitive.

It would therefore be desirable to have a system for sensing primary transformer current that provides multiple sensing ranges.

BRIEF DESCRIPTION OF THE INVENTION

According to an aspect of the invention, a current monitoring system comprises a current sensor configured to sense a first current passing through a conductor and a voltage conversion device coupled to the current sensor and configured to receive a second current from the current sensor and convert the second current into a first voltage. A first scaling circuit is coupled to the voltage conversion device and configured to convert the first voltage to a second voltage proportional to the first current based on a first scaling factor, and a second scaling is circuit coupled to the voltage conversion device and configured to convert the first voltage to a third voltage proportional to the first current based on a second scaling factor, wherein the second scaling factor is different from the first scaling factor.

According to another aspect of the invention, a method of manufacturing a current-to-voltage conversion system comprises coupling a current sensor to a conductor configured to pass a current therethrough and coupling a voltage conversion device to the current sensor, the voltage conversion device configured to generate a sensor voltage proportional to the current passing through the conductor. The method also comprises coupling a first scaling circuit to the voltage conversion device and coupling a second scaling circuit to the voltage conversion device. The first scaling circuit is configured to convert the sensor voltage to a first scaled voltage using a first scaling factor, and the second scaling circuit is configured to convert the sensor voltage to a second scaled voltage using a second scaling factor distinct from the first scaling factor.

According to yet another aspect of the invention, a motor current detection system comprises a motor comprising a primary winding, an electrical conductor electrically coupled to the primary winding and configured to carry a primary current passing through the primary winding, and a current transformer inductively coupled to the electrical conductor and configured to inductively generate a secondary current proportional to the primary current. The system also comprises a current-to-voltage converter configured to convert the secondary current to a first voltage and a pair of scaling circuits coupled to the current-to-voltage converter, each scaling circuit configured to scale the first voltage to a unique scaling voltage via a unique scaling factor.

Various other features and advantages of the present invention will be made apparent from the following detailed description and the drawings.

BRIEF DESCRIPTION OF THE DRAWINGS

The drawings illustrate preferred embodiments presently contemplated for carrying out the invention.

In the drawings.

DETAILED DESCRIPTION

Figure 1:
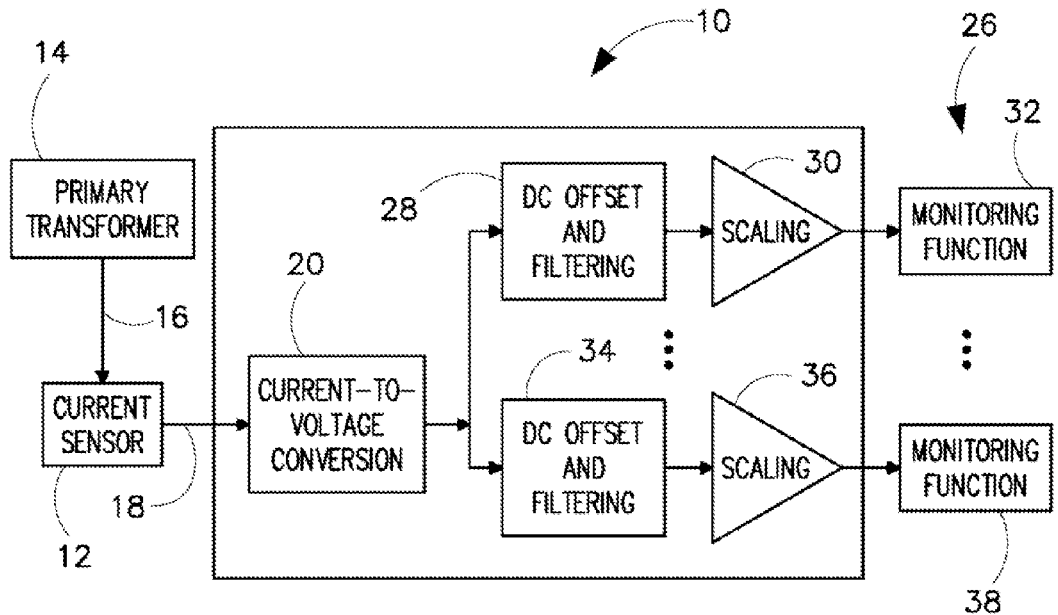
FIG. 1 is a block diagram of a primary transformer current monitoring system according to an embodiment of the invention.

FIG. 1 illustrates a block diagram of the motor current monitoring system 10 according to an embodiment of the invention. Monitoring system 10 includes a current sensing device 12 positioned to sense a transformer primary current of a primary transformer 14 such as a soft starter or other industrial motor. In one embodiment, current sensing device 12 is a current transformer inductively coupled to a conductor 16 leading to or from primary transformer 14. A secondary current 18 representative of the primary current passing through primary transformer 14 is output from current sensing device 12 and is converted to a voltage via a current-to-voltage device 20 such as a resistor. The voltage, which is representative of the current passing through primary transformer 14, is supplied to multiple scaling circuits 22, 24, which, according to embodiments of the invention, provide voltages to monitoring systems 26 designed to monitor the operational status of primary transformer 14. Scaling circuits 22, 24 and thus configured to output respective voltages that are proportional to the primary transformer current and that are scaled differently.

Scaling circuit 22 includes a block 28 that provides DC offset and EMC filtering functions to scaling circuit 22. In this manner, the voltage provided to scaling circuit 22 from current-to-voltage device 20 is filtered and provided to a scaling block 30 having a gain or attenuation configured to scale the filtered voltage according to a scale desired for a first monitoring system 32, which converts the scaled voltage from an analog signal into a digital signal. According to one embodiment, scaling circuit 22 may be designed to monitor the operation of primary transformer 14 within its normal steady-state operation parameters, which may include monitoring primary transformer currents within the range of 5% of motor nominal FLA to 120% motor FLA. Preferably, the scaling output of scaling circuit 22 is adjusted to provide the maximum dynamic range to first monitoring system 32 when monitoring the normal operating range of primary transformer 14.

Scaling circuit 24 includes a block 34 that provides DC offset and EMC filtering functions to scaling circuit 24. In this manner, the voltage provided to scaling circuit 24 from current-to-voltage device 20 is filtered and provided to a scaling block 36 having a gain or attenuation configured to scale the filtered voltage according to a scale desired for a second monitoring system 38, which converts the scaled voltage from an analog signal into a digital signal. According to one embodiment, scaling circuit 24 may be designed to monitor the operation of primary transformer 14 for an overload condition, which may include monitoring primary transformer currents within the range of 120% motor FLA to 800% motor FLA. The scaling output of scaling circuit 24 may thus be adjusted to provide a Volts/Amp gain that is a fraction of the monitoring channel so that an entire overload range can be sensed.

Additional scaling circuits (not shown) may also be included and coupled to current-to-voltage device 20. The additional scaling circuits may each have distinct scaling corresponding to a particular range of primary transformer current operation and may each provide distinct monitoring voltages to respective monitoring system. In this manner, scaling circuits that are proportional to specific dynamic current ranges can be used to pinpoint specific current ranges that may benefit from increased current sensitivity.

Thus, according to embodiments of the invention, monitoring system 10 provides multiple scaled outputs of a primary transformer operation from a single current measurement. In this manner, the resolution for various ranges of monitored primary transformer current may be tailored such that the analog-to-digital conversion thereof may have a high resolution for a fine current monitor, a lower resolution for a coarse current monitor, or an intermediate resolution for an intermediate current monitor. For example, the fine current monitor range can provide an output with a much greater volts/amp transfer function than the coarse current monitor range.

Figure 2:
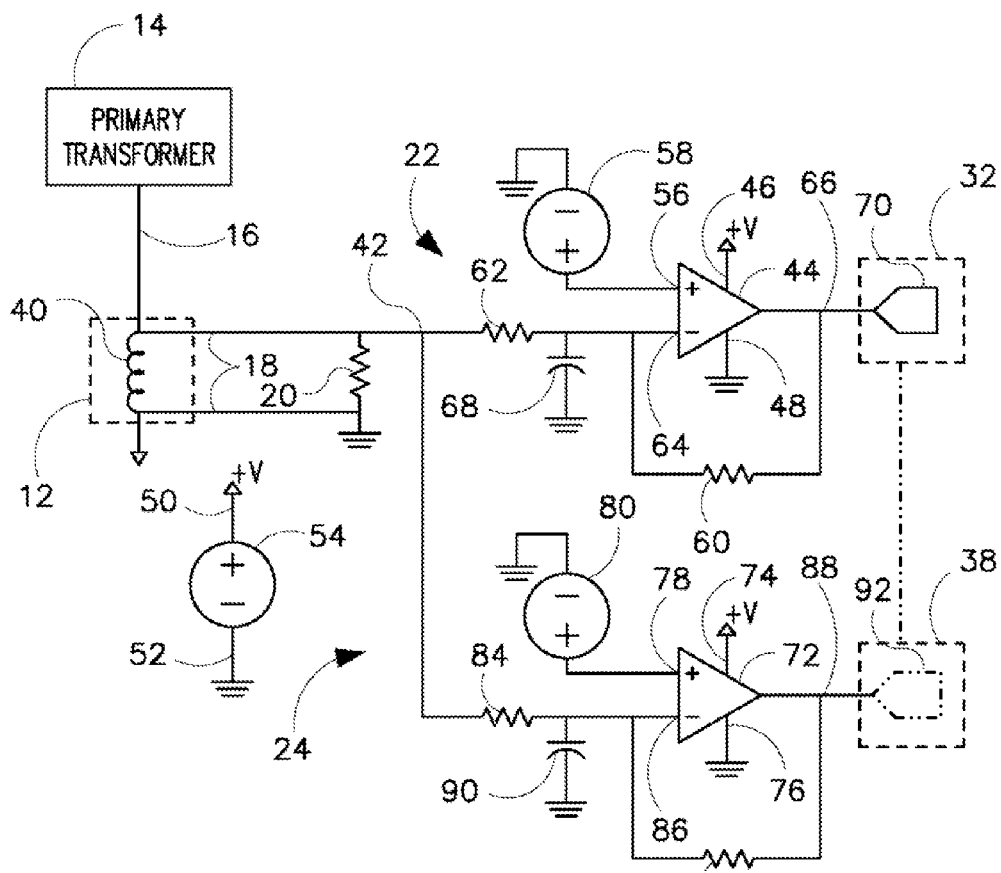
FIG. 2 is a schematic illustration of the primary transformer current monitoring system of FIG. 1 according to an embodiment of the invention.

FIG. 2 illustrates a schematic illustration of the primary transformer current monitoring system 10 of FIG. 1 according to an embodiment of the invention. Similar components discussed in connection with the embodiments shown in FIGS. 1 and 2 have been designated with similar reference numerals As shown in FIG. 2, current sensing device 12 includes a coil 40 looped around conductor 16. In one embodiment, coil 40 has multiple turns looped around conductor 16. Accordingly, a current from primary transformer 14 passing through coil 40 along conductor 16 inductively generates a current in coil 40 that is converted to a voltage via current-to-voltage device 20, which is a resistor as shown. The current induced in coil 40 and, hence, the voltage generated across resistor 20 is proportional to the current passing to or from primary transformer 14 along conductor 16. The proportional voltage is available at a node 42 coupled to scaling circuits 22, 24 and to other additional scaling circuits (not shown) as described above.

Scaling circuit 22 includes an amplifier 44 having a pair of power terminals 46, 48 electrically coupled to a positive DC voltage bus 50 and to a ground bus 52, respectively. A single, positive DC power supply 54 is coupled between positive DC voltage bus 50 and ground bus 52 and provides single-source power to energize amplifier 44. A positive voltage input 56 of amplifier 44 is configured to receive a first DC offset voltage 58 designed, in one embodiment, based on a combination (e.g., multiplication) of the median of a desired output voltage range of scaling circuit 22 with an inverse of the scaling factor of scaling circuit 22. The scaling factor of scaling circuit 22 may be determined by a pair of resistors 60, 62 coupled to node 42 and between a negative voltage input 64 of amplifier 44 and a scaled voltage output 66 of amplifier 44. A capacitor 68 is also coupled to negative voltage input 64 and helps provide EMC filtering of the voltage at negative voltage input 64. First monitoring system 32 includes an analog-to-digital converter 70 according to an embodiment of the invention.

Scaling circuit 24 includes an amplifier 72 having a pair of power terminals 74, 76 electrically coupled to positive DC voltage bus 50 and ground bus 52, respectively A positive voltage input 78 of amplifier 72 is configured to receive a second DC offset voltage 80 designed, in one embodiment, based on a combination (e.g., multiplication) of the median of a desired output voltage range of scaling circuit 24 with an inverse of the scaling factor of scaling circuit 24. The scaling factor of scaling circuit 24 may be determined by a pair of resistors 82, 84 coupled to node 42 and between a negative voltage input 86 of amplifier 72 and a scaled voltage output 88 of amplifier 72. A capacitor 90 is also coupled to negative voltage input 86 and helps provide EMC filtering of the voltage at negative voltage input 86. Second monitoring system 38 includes an analog-to-digital converter 92 according to an embodiment of the invention.

In one embodiment, analog-to-digital converters 70 and 92 are distinct converters and may be dedicated to their respective scaling circuits 22 and 24. According to another embodiment, analog-to-digital converters 70 and 92 correspond with the same converter, and the analog-to-digital conversion of the voltages output from scaling circuits 22 and 24 is alternately performed. When the analog-to-digital conversion according to either embodiment occurs using a common bit conversion process, the conversion of the smaller range output from scaling circuit 22 results in a higher resolution step size in the digital data than the conversion of the larger range output from scaling circuit 24.

As described above, additional scaling circuits (not shown) may also be included and may coupled to node 42. The additional scaling circuits may each have distinct scaling corresponding to a particular range of primary transformer current operation and may each provide distinct monitoring voltages to respective monitoring system. Similar to scaling circuits 22 and 24, the scaling of the additional circuits may be designed via setting the parameters of the pair of resistors as well as the DC offset voltage of each circuit.

According to embodiments of the invention, primary transformer operational status may be monitored by multiple monitoring circuits using a relatively minimum number of components per circuit in conjunction with a single, positive power supply. In this manner, a high level of immunity to external interference is provided as well as the monitoring capability of a plurality of monitoring circuits each having an optimal resolution and accuracy of the sensed primary transformer current particular to a desired monitoring system. Accordingly, multiple levels of primary transformer current status may be monitored for a wide current range without maxing out the monitoring capability of certain current ranges and while maintaining accuracy throughout the entire current monitoring range.

Therefore, according to one embodiment of the invention, a current monitoring system comprises a current sensor configured to sense a first current passing through a conductor and a voltage conversion device coupled to the current sensor and configured to receive a second current from the current sensor and convert the second current into a first voltage. A first scaling circuit is coupled to the voltage conversion device and configured to convert the first voltage to a second voltage proportional to the first current based on a first scaling factor, and a second scaling is circuit coupled to the voltage conversion device and configured to convert the first voltage to a third voltage proportional to the first current based on a second scaling factor, wherein the second scaling factor is different from the first scaling factor.

According to another embodiment of the invention, a method of manufacturing a current-to-voltage conversion system comprises coupling a current sensor to a conductor configured to pass a current therethrough and coupling a voltage conversion device to the current sensor, the voltage conversion device configured to generate a sensor voltage proportional to the current passing through the conductor. The method also comprises coupling a first scaling circuit to the voltage conversion device and coupling a second scaling circuit to the voltage conversion device. The first scaling circuit is configured to convert the sensor voltage to a first scaled voltage using a first scaling factor, and the second scaling circuit is configured to convert the sensor voltage to a second scaled voltage using a second scaling factor distinct from the first scaling factor.

According to yet another embodiment of the invention, a motor current detection system comprises a motor comprising a primary winding, an electrical conductor electrically coupled to the primary winding and configured to carry a primary current passing through the primary winding, and a current transformer inductively coupled to the electrical conductor and configured to inductively generate a secondary current proportional to the primary current. The system also comprises a current-to-voltage converter configured to convert the secondary current to a first voltage and a pair of scaling circuits coupled to the current-to-voltage converter, each scaling circuit configured to scale the first voltage to a unique scaling voltage via a unique scaling factor.

Embodiments of the present invention have been described in terms of the preferred embodiment, and it is recognized that equivalents, alternatives, and modifications, aside from those expressly stated, are possible and within the scope of the appending claims.

What is claimed is:

1. A current monitoring system comprising:
a transformer comprising a primary winding;
a conductor electrically coupled to the primary winding and configured to carry a first current passing through the primary winding;
a current sensor configured to sense the first current passing through the conductor;
a voltage conversion device coupled to the current sensor and configured to receive a second current from the current sensor and convert the second current into a first voltage;
a first scaling circuit coupled to the voltage conversion device and configured to convert the first voltage to a second voltage proportional to the first current based on a first scaling factor; and
a second scaling circuit coupled to the voltage conversion device and configured to convert the first voltage to a third voltage proportional to the first current based on a second scaling factor, wherein the second scaling factor is different from the first scaling factor;
wherein the first scaling circuit monitors operation of the transformer for a steady-state operating condition; and
wherein the second scaling circuit monitors operation of the transformer for an overload condition.

2. The current monitoring system of claim 1 wherein the current sensor comprises a current transformer.

3. The current monitoring system of claim 1 wherein the current sensor is configured to inductively sense the first current.

4. The current monitoring system of claim 3 wherein the current sensor comprises a multi-turn coil configured to be positioned about the conductor.

5. The current monitoring system of claim 1 wherein the voltage conversion device comprises a resistor.

6. The current monitoring system of claim 1 further comprising a positive DC power supply coupled to a DC power bus and to a ground bus;
wherein the first scaling circuit comprises a first amplifier comprising a positive power terminal coupled to the DC power bus and a negative power terminal coupled to the ground bus; and
wherein the second scaling circuit comprises a second amplifier comprising a positive power terminal coupled to the DC power bus and a negative power terminal coupled to the ground bus.

7. The current monitoring system of claim 6 wherein the first scaling circuit further comprises a first resistor coupled to a negative voltage input of the first amplifier and a second resistor coupled between the negative voltage input of the first amplifier and a voltage output of the first amplifier, wherein the first resistor of the first amplifier is coupled to the voltage conversion device and configured to receive the first voltage therefrom; and
wherein the second scaling circuit further comprises a first resistor coupled to a negative voltage input of the second amplifier and a second resistor coupled between the negative voltage input of the second amplifier and a voltage output of the second amplifier, wherein the first resistor of the second amplifier is coupled to the voltage conversion device and configured to receive the first voltage therefrom.

8. The current monitoring system of claim 7 wherein a relationship of the first and second resistors of the first scaling circuit determine the first scaling factor; and
wherein a relationship of the first and second resistors of the second scaling circuit determine the second scaling factor.

9. The current monitoring system of claim 7 wherein the first scaling circuit further comprises a filter capacitor coupled to the negative voltage input of the first amplifier and coupled to the ground bus; and
wherein the second scaling circuit further comprises a filter capacitor coupled to the negative voltage input of the second amplifier and coupled to the ground bus.

10. The current monitoring system of claim 1 further comprising a first analog-to-digital converter coupled to the first scaling circuit and configured to convert the second voltage to a digital value.

11. The current monitoring system of claim 10 wherein the first analog-to-digital converter is further coupled to the second scaling circuit and configured to convert the third voltage to a digital value.

12. The current monitoring system of claim 10 further comprising a second analog-to-digital converter coupled to the second scaling circuit and configured to convert the third voltage to a digital value.

13. A method of manufacturing a current-to-voltage conversion system comprising:
providing a transformer comprising a primary winding;
coupling a conductor to the transformer;
coupling a current sensor to the conductor configured to pass a current therethrough;
coupling a voltage conversion device to the current sensor, the voltage conversion device configured to generate a sensor voltage proportional to the current passing through the conductor;
coupling a first scaling circuit to the voltage conversion device, the first scaling circuit configured to convert the sensor voltage to a first scaled voltage using a first scaling factor;
coupling a second scaling circuit to the voltage conversion device, the second scaling circuit configured to convert the sensor voltage to a second scaled voltage using a second scaling factor distinct from the first scaling factor;
selectively operating the first scaling circuit to convert the sensor voltage to the first scaled voltage during operation of the transformer in a steady-state operating condition; and
selectively operating the second scaling circuit to convert the sensor voltage to the second scaled voltage during operation of the transformer in an overload condition.

14. The method of claim 13 further comprising forming the first scaling circuit comprising:
coupling a first amplifier to a first pair of resistors configured to define the first scaling factor; and
coupling a pair of powered terminals of the first amplifier to a single, positive voltage supply; and
further comprising forming the second scaling circuit comprising:
coupling a second amplifier to a second pair of resistors configured to define the second scaling factor; and
coupling a pair of powered terminals of the second amplifier to the single, positive voltage supply.

15. The method of claim 13 further comprising coupling an analog-to-digital converter to the first and second scaling circuits;
configuring the analog-to-digital converter to convert an analog voltage output from the first scaling circuit into a digital signal formed of a plurality of bits; and
configuring the analog-to-digital converter to convert an analog voltage output from the second scaling circuit into a digital signal formed of the plurality of bits.

16. The method of claim 13 wherein the steady-state operating condition of the transformer comprises operation of the transformer with currents within a range of 5% of motor nominal full load amperes to 120% motor full load amperes; and
wherein the overload condition of the transformer comprises operation of the transformer with currents within a range of 120% of motor full load amperes to 800% motor full load amperes.

17. A current detection system comprising:
a transformer comprising a primary winding;
an electrical conductor electrically coupled to the primary winding and configured to carry a primary current passing through the primary winding;
a current transformer inductively coupled to the electrical conductor and configured to inductively generate a secondary current proportional to the primary current;
a current-to-voltage converter configured to convert the secondary current to a first voltage; and
a pair of scaling circuits coupled to the current-to-voltage converter, each scaling circuit configured to scale the first voltage to a unique scaling voltage via a unique scaling factor;
wherein the pair of scaling circuits comprises:
a first scaling circuit of the pair of scaling circuits configured such that the scaling factor thereof scales the first voltage based on a first resolution; and
a second scaling circuit the pair of scaling circuits configured such that the scaling factor thereof scales the first voltage based on a second resolution greater than the first resolution; and
wherein the pair of scaling circuits are selectively operated such that the first scaling circuit scales the first voltage based on the first resolution during operation of the transformer in a steady-state operating condition and the second scaling circuit scales the first voltage based on the second resolution during operation of the transformer in an overload condition.

18. The current detection system of claim 17 wherein the current-to-voltage converter comprises a resistor.

19. The current detection system of claim 17 further comprising an analog-to-digital converter coupled to the pair of scaling circuits and configured to convert the unique scaling voltages to digital voltage signals having unique ranges.

20. The current detection system of claim 17 wherein the scaling performed by the second scaling circuit is adjustable so as to provide a Volts/Amp gain that is a fraction of an allowable overall monitoring channel Volts/Amp gain, such that an entire overload range can be sensed.

* * * * *